(12) United States Patent
Shin

(10) Patent No.: US 7,388,748 B2
(45) Date of Patent: Jun. 17, 2008

(54) PLASMA DISPLAY DEVICE

(75) Inventor: Dong-Hyok Shin, Chunan-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 205 days.

(21) Appl. No.: 11/322,449

(22) Filed: Dec. 29, 2005

(65) Prior Publication Data

US 2006/0187641 A1 Aug. 24, 2006

(30) Foreign Application Priority Data

Feb. 22, 2005 (KR) ........................ 10-2005-0014433

(51) Int. Cl.
*H05K 7/20* (2006.01)
*G09G 3/28* (2006.01)

(52) U.S. Cl. .................. 361/704; 361/719; 345/60; 345/905

(58) Field of Classification Search .................. None
See application file for complete search history.

(56) References Cited

U.S. PATENT DOCUMENTS

| | | | | |
|---|---|---|---|---|
| 6,411,353 | B1 * | 6/2002 | Yarita et al. .................. 349/59 |
| 6,522,543 | B2 * | 2/2003 | Kurihara et al. ............. 361/704 |
| 7,064,952 | B1 * | 6/2006 | Chen et al. .................. 361/681 |
| 7,167,365 | B2 * | 1/2007 | Fu et al. ..................... 361/697 |
| 2005/0068738 | A1 * | 3/2005 | Kim et al. .................. 361/704 |
| 2006/0158835 | A1 * | 7/2006 | Lin et al. .................... 361/681 |
| 2006/0158851 | A1 * | 7/2006 | Bae et al. ................... 361/700 |
| 2006/0198089 | A1 * | 9/2006 | Cho .......................... 361/681 |

FOREIGN PATENT DOCUMENTS

| | | |
|---|---|---|
| JP | 2001-265237 | 9/2001 |
| JP | 2001-308256 | 11/2001 |
| JP | 2001-352022 | 12/2001 |
| JP | 2004126151 A * | 4/2004 |
| KR | 1020040041945 A | 5/2004 |

OTHER PUBLICATIONS

Patent Abstracts of Japan, Publication No. 2001-265237, published on Sep. 28, 2001 in the name of Kotake.
Patent Abstracts of Japan, Publication No. 2001-308256, published on Nov. 02, 2001 in the name of Inoue et al.
Patent Abstracts of Japan, Publication No. 2001-352022, published on Dec. 21, 2001 in the name of Inoue et al.
Korean Patent Abstracts, Publication No. 10-2004-0041945, published on May 20, 2004 in the name of Ahn et al.

* cited by examiner

*Primary Examiner*—Boris Chervinsky
(74) *Attorney, Agent, or Firm*—Christie, Parker & Hale, LLP

(57) ABSTRACT

A display device that efficiently dissipates high temperature heat generated from a driver IC of a driver IC package. The display device includes a display panel, a chassis base having the display panel on a first surface, the printed circuit board assembly mounted at a second surface of the chassis base the second surface being opposite to the first surface, and a driver IC package having a driver IC connected to an electrode of the display device and the printed circuit board assembly. Additionally, the display device may include a thermal conduction sheet inserted between the display device and the chassis base and having an extension portion formed at a position corresponding to the driver IC, and a thermal conduction member formed between the extension portion of the thermal conduction sheet and the chassis base.

19 Claims, 8 Drawing Sheets

PLASMA DISPLAY DEVICE

CROSS-REFERENCE TO RELATED APPLICATION

This application claims priority to and the benefit of Korean Patent Application No. 10-2005-0014433 filed in the Korean Intellectual Property Office on Feb. 22, 2005, the entire content of which is incorporated herein by reference.

BACKGROUND OF THE INVENTION

1. Field of the Invention

The present invention relates to a display device, and more particularly, to a plasma display device.

2. Description of the Related Art

Recently, a number of various display devices have been developed. Among these display devices is a plasma display device which incorporates a plasma display panel (PDP). A PDP is a display device that displays an image by using visible light generated from a phosphor layer excited with vacuum ultraviolet (VUV) which is emitted from plasma generated by gas discharge.

A typical plasma display device includes the PDP, a chassis base supporting the PDP, a printed circuit board assembly (PBA) connected to a display electrode or an address electrode located in the PDP through a flexible printed circuit (FPC) and connectors, and a case enclosing the PDP, chassis base, and PBA.

The chassis base supports the PDP and PBA, and dissipates heat generated during the operation of the PDP by rapidly transferring and diffusing the heat.

However, by using only the chassis base, diffusion of heat generated during the operation of the PDP is limited, and thereby performance of the PDP may be reduced due to the heat generated during the operation. In particular, much heat is generated by a driver integrated circuit (IC), which generates a pulse to be applied to an address electrode.

The above information disclosed in this Background section is only for enhancement of understanding of the background of the invention, and therefore it may contain information that does not form the prior art that is already known in this country to a person of ordinary skill in the art.

SUMMARY OF THE INVENTION

A display device is provided that efficiently dissipates heat generated from a driver IC of a driver IC package.

An exemplary display device according to an embodiment of the present invention includes a display panel having at least one electrode and a display panel first surface, a chassis base mounted on a display panel first surface, a printed circuit board assembly (PBA) mounted on a second surface of the chassis base, the second surface being opposite the first surface, and a driver IC package having driver ICs and being connected to the electrode of the PDP and PBA. Additionally, the display device includes a thermal conduction sheet inserted between the display panel and the chassis base and having an extension portion formed at a location corresponding to the driver IC, and a thermal conduction member mounted at a location corresponding to the driver IC between the extension portion of the thermal conduction sheet and the chassis base. The driver IC package may be formed with a tape carrier package. The display panel may be, for example, a PDP.

The thermal conduction member may have a first surface facing the extension portion of the thermal conduction sheet and a second surface opposite to the first surface. Here, a heat dissipation fin may be formed at either the first surface or the second surface.

A hole into which the heat dissipation fin is inserted may be formed on the extension portion of the thermal conduction sheet or the chassis base corresponding to the heat dissipation fin. Alternatively, an edge surface of the heat dissipation fin may be fixed to the extension portion of the thermal conduction sheet or the chassis base.

A reinforcing portion may be formed near an edge of the chassis base. The reinforcing portion provides a space between the thermal conduction sheet and the chassis base for the installation of the thermal conduction member at a position corresponding to the driver IC.

The reinforcing portion of the chassis base may include a first portion extended in a direction opposite to the display panel, and a second portion extended parallel to the surface where the display panel is mounted, from the first portion.

A first heat dissipation fin and a second heat dissipation fin may be formed respectively at the first surface and the second surface of the thermal conduction member. A first hole and a second hole may be formed respectively on the extension part of the thermal conduction sheet and the second portion of the chassis base, and respectively on the first heat dissipation fin and the second heat dissipation fin.

The first heat dissipation fin is inserted into the first hole and the second heat dissipation fin is inserted into the second hole. The thermal conduction member may be fixed between the thermal conduction sheet and the chassis base.

The heat dissipation fin may be formed only on the first surface of the thermal conduction member.

Here, an edge surface of the heat dissipation fin formed on the first surface of the heat conduction member may be fixed to the extension portion of the thermal conduction sheet, and the second surface of the thermal conduction member may be fixed to the second portion of the chassis base.

A first heat dissipation fin and a second heat dissipation fin may be formed respectively at the first surface and the second surface of the thermal conduction member, and the edge surfaces of the first heat dissipation fin and the second heat dissipation fin may be fixed respectively to the extension portion of the thermal conduction sheet and the second portion of the chassis base.

At least two thermal conduction members having different shapes may be mounted between the chassis base and the extension portion of the thermal conduction sheet. Here, a first thermal conduction member may have a heat dissipation fin, and a second thermal conduction member may substantially be formed as a rectangular parallelepiped.

The heat dissipation fin may be formed as a cylinder or plate.

DETAILED DESCRIPTION OF THE EMBODIMENTS

Figure 1:
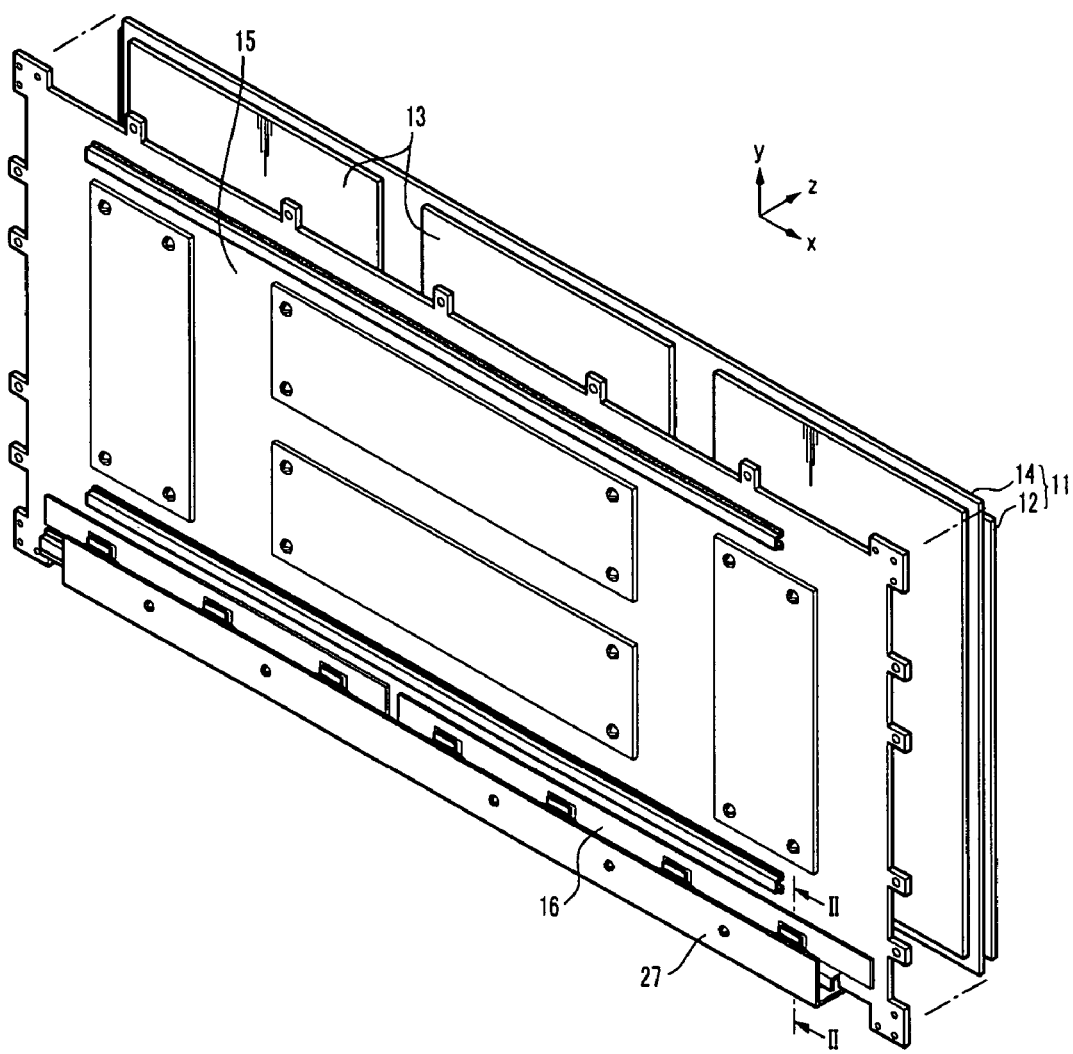
FIG. 1 is an exploded perspective view of a plasma display device according to an exemplary embodiment of the present invention.
Figure 2:
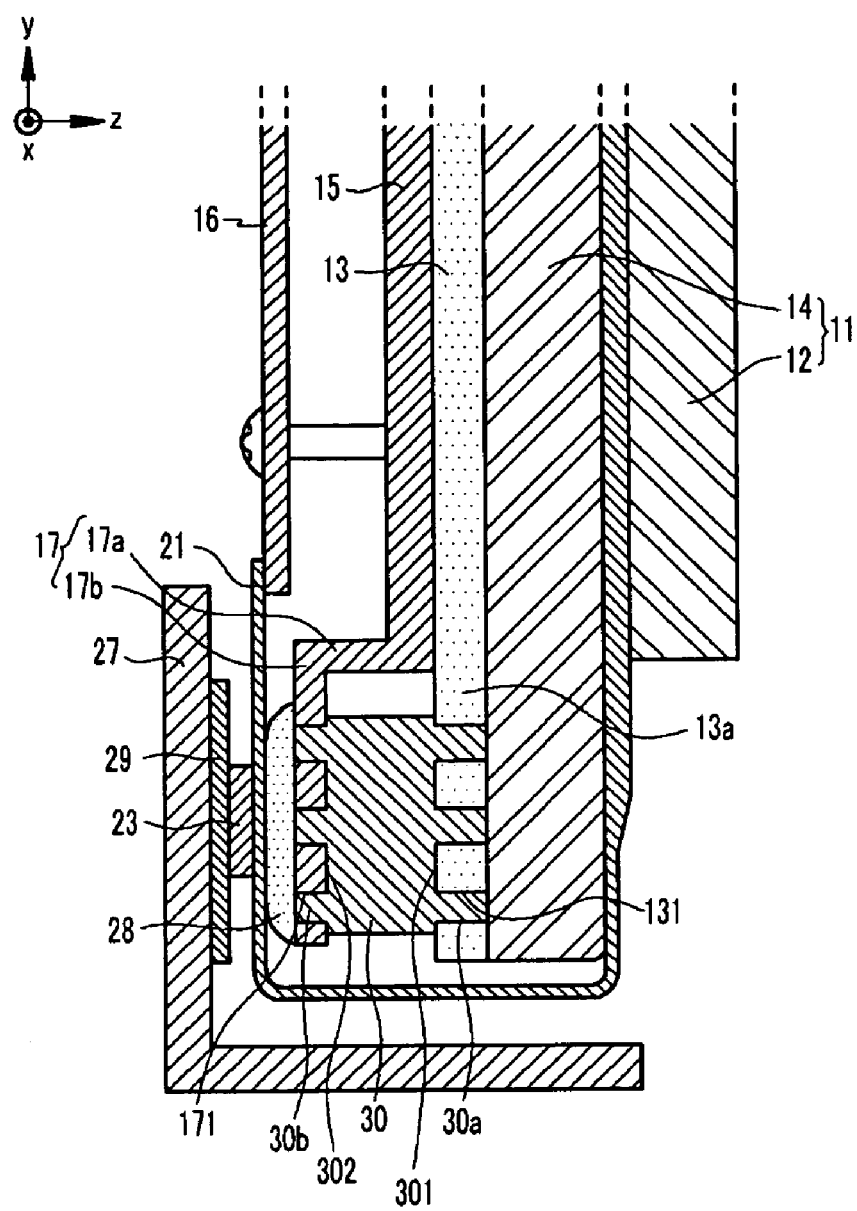
FIG. 2 is a partial sectional view taken along the line II-II of FIG. 1.

With respect to FIGS. 1 and 2, a plasma display device according to an exemplary embodiment of the present includes a PDP 11 mounted on a first surface of a chassis base 15 having a thermal conduction sheet 13 inserted therebetween, and a PBA 16 mounted on a second surface of the chassis base 15, the second surface being opposite to the first surface. Additionally, a driver IC package 21 is formed to be connected to an electrode of the PDP 11 and the PBA 16. The driver IC package 21 includes a driver IC 23. A thermal conduction member 30 is mounted corresponding to the driver IC 23 between the thermal conduction sheet 13 and the chassis base 15.

In more detail, the PDP 11 has a front plate 12 and a rear plate 14 fixed to each other, forming discharge cells therebetween. Generally, the rear plate 14 includes an address electrode on a rear substrate, and the front plate 12 includes display electrodes on a front substrate.

A discharge cell to be activated is selected by an address discharge generated between one of the display electrodes and the address electrode, and an image is displayed by sustain discharges generated between the display electrodes. However, the present invention may be applied to display panels having various structures, for example with additional electrodes, which will still fall within the spirit and scope of the present invention.

The PDP 11 is mounted on the first surface of the chassis base 15 with the thermal conduction sheet 13 inserted therebetween. Additionally, the PBA 16 is mounted on the second surface of the chassis base 15, the second surface being opposite to the first surface.

A plurality of thermal conduction sheets 13 may be provided to increase a bonding strength between the PDP 11 and the chassis base 15. For example, the bonding strength between the PDP 11 and the chassis base 15 may be increased by coupling the PDP 11 and the chassis base 15 with double-sided adhesive tape (not shown) disposed between the thermal conduction sheets 13. However, the present invention is not limited thereto, and alternately only one thermal conduction sheet may be provided for balanced heat dissipation.

The thermal conduction sheet 13 may be made from various materials having good thermal conductivity, such as an acrylic heat dissipation material, a graphite heat dissipation material, a metallic heat dissipation material, or a carbon nano-tube heat dissipation material.

The thermal conduction sheet 13 serves to transfer heat generated from the PDP 11 to the chassis base 15 and to protect the PDP 11 which is generally made of glass.

As shown in FIG. 2, the thermal conduction sheet 13 according to the present exemplary embodiment is extended to the region corresponding to the driver IC 23 to effectively dissipate heat generated from the driver IC 23. In other words, the thermal conduction sheet 13 has an extension portion 13a in the region corresponding to the driver IC 23.

Additionally, a reinforcing portion 17 may be formed near an edge of the chassis base 15 to improve the mechanical strength of the chassis base 15. As shown in FIG. 2, the reinforcing portion 17 of the chassis base 15 may be formed at a position where the reinforcing portion 17 does not interfere with the PBA 16 which is installed on the second surface of the chassis base 15.

In the present exemplary embodiment, the reinforcing portion 17 of the chassis base 15 includes a first portion 17a extending perpendicular to a planar surface of the PDP 11, and a second portion 17b extending from the first portion 17a, parallel to the planar surface on which the PDP 11 is mounted. The chassis base 15 may be formed by pressing a metal plate.

The reinforcing portion 17 serves to protect the chassis base 15 from distortion and bending stresses, and provides a space between the thermal conduction sheet 13 and the chassis base 15 corresponding to a portion where the driver IC 23 is mounted. The PBA 16 according to the present exemplary embodiment is formed by mounting components on a printed circuit board.

Additionally, a cover plate 27 is mounted on the second portion 17b of the chassis base 15 by setscrews (not shown), and the driver IC package 21 is disposed between the second portion 17b and the cover plate 27. The driver IC package 21 may be formed with a tape carrier package (TCP).

The driver IC package 21 is connected to the address electrode of the PDP 11 and the PBA 16, and has a driver IC 23 generating a pulse voltage to be applied to the address electrode of the PDP 11.

Thermal grease 28 is interposed between the second portion 17b of the chassis base 15 and the driver IC package 21, and another thermal conduction sheet 29 is located between the driver IC package 21 and the cover plate 27. The thermal grease 28 and the thermal conduction sheet 29 serve to dissipate heat generated from the vicinity of the driver IC 23 to the second portion 17b of the chassis base 15 and the cover plate 27.

A thermal conduction member 30 is mounted in a space between the extension portion 13a of the thermal conduction sheet 13 and the reinforcing portion 17 of the chassis base 15. The thermal conduction member 30 may be mounted by fixing means using a friction-fitting method or a fastening member such as a setscrew. Stability of fastening the thermal conduction member 30 may be improved if the thermal conduction member 30 is mounted by a fastening member combined with the friction-fitting method.

Figure 3:
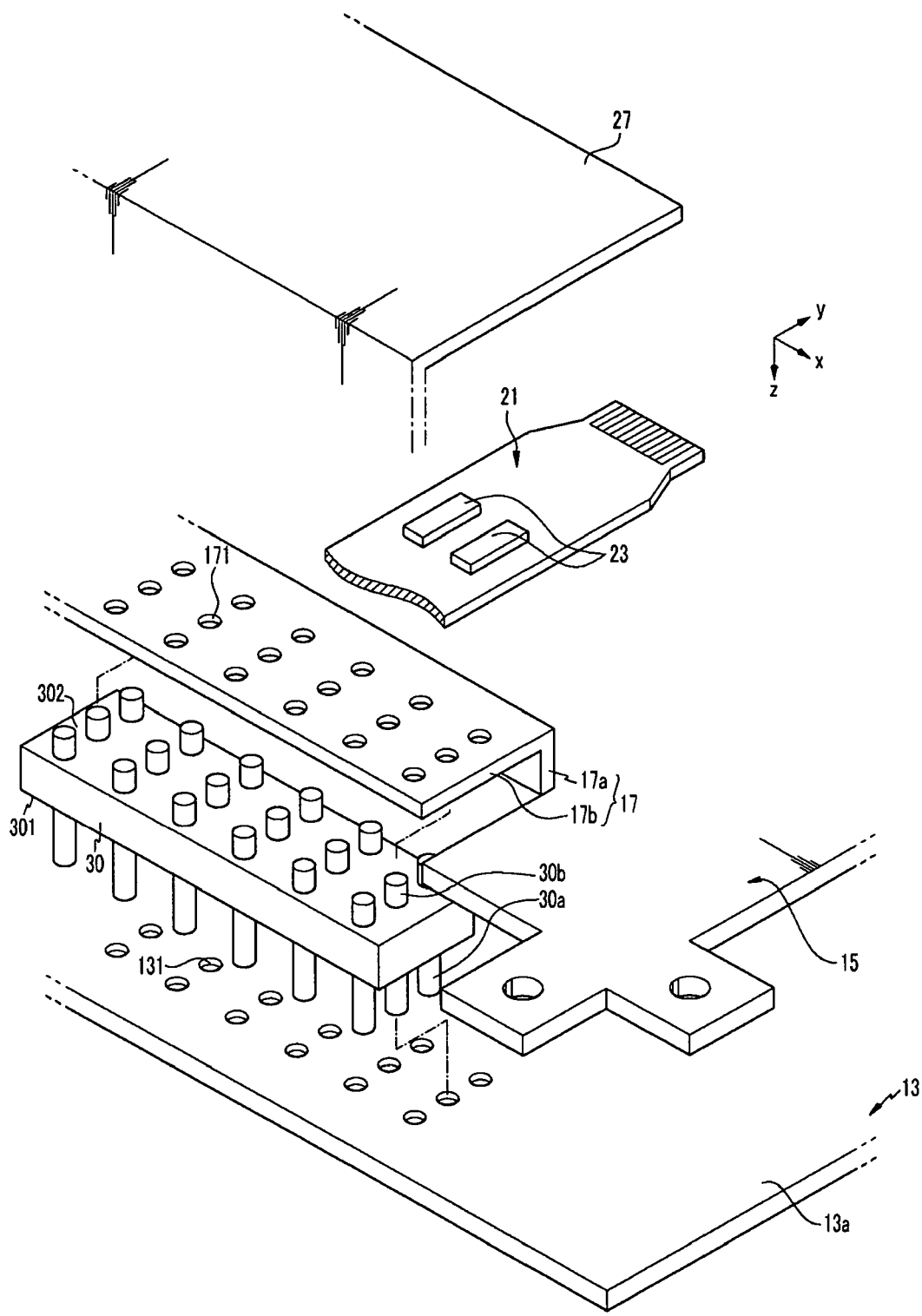
FIG. 3 is an exploded perspective view showing an assembly method of a thermal conduction member in the plasma display device of FIG. 1.

A detailed structure and an assembling method of the thermal conduction member 30 will be described referring to FIG. 3. FIG. 3 is a partial exploded perspective view showing an assembly method of a thermal conduction member in the plasma display device according to FIGS. 1 and 2.

The thermal conduction member 30 according to the present exemplary embodiment has a first surface 301 facing the extension portion 13a of the thermal conduction sheet 13, and a second surface 302 facing the second portion 17b of the chassis base 15. Additionally, a first heat dissipation fin 30a is formed at the first surface 301 of the thermal conduction member 30 in cylinder form, and a second heat dissipation fin 30b is formed at the second surface 302 of the thermal conduction member 30 in cylinder form.

The first heat dissipation fin 30a and the second heat dissipation fin 30b are provided with a wide surface area for increasing a heat dissipation area of the thermal conduction member 30.

A first hole 131 corresponding to the first heat dissipation fin 30a is formed at the extension portion 13a of the thermal conduction sheet 13, and a second hole 171 corresponding to the second heat dissipation fin 30b is formed at the second portion 17b of the chassis base 17.

Here, the first heat dissipation fin 30a of the thermal conduction member 30 is inserted into the first hole 131 of the extension portion 13a, and the second heat dissipation fin 30b of the thermal conduction member 30 is inserted into the second hole 171 of the second portion 17b. The thermal conduction member 30 is thereby fixed to the thermal conduction sheet 13 and the chassis base 15. The first heat dissipation fin 30a and the second heat dissipation fin 30b may have the same thicknesses as those of the extension portion 13a and the second portion 17b, respectively, so as to be securely insertable into the first hole 131 and the second hole 171, respectively.

The contact area between the thermal conduction member 30 and the thermal conduction sheet 13, and the contact area between the thermal conduction member 30 and the chassis base 15 may be maximized by securely inserting the first heat dissipation fin 30a and the second heat dissipation fin 30b into the first hole 131 and the second hole 171, respectively. Therefore, efficiency of heat dissipation is improved by more rapidly diffusing the heat generated from the driver IC 23.

As described above, in the present exemplary embodiment the thermal conduction sheet 13 is extended to the vicinity of the driver IC 23 where more heat is generated than at any other position, and the thermal conduction member 30 is disposed at a position corresponding to the driver IC 23. Accordingly, heat diffusion may be increased in the vicinity of the driver IC 23, thereby avoiding various problems created by heat generated in this area.

Hereinafter, a plasma display devices according to FIGS. 4-8 will be described in detail. Since basic configurations of these display devices are similar to those previously described, descriptions of the components already described will be omitted.

Figure 4:
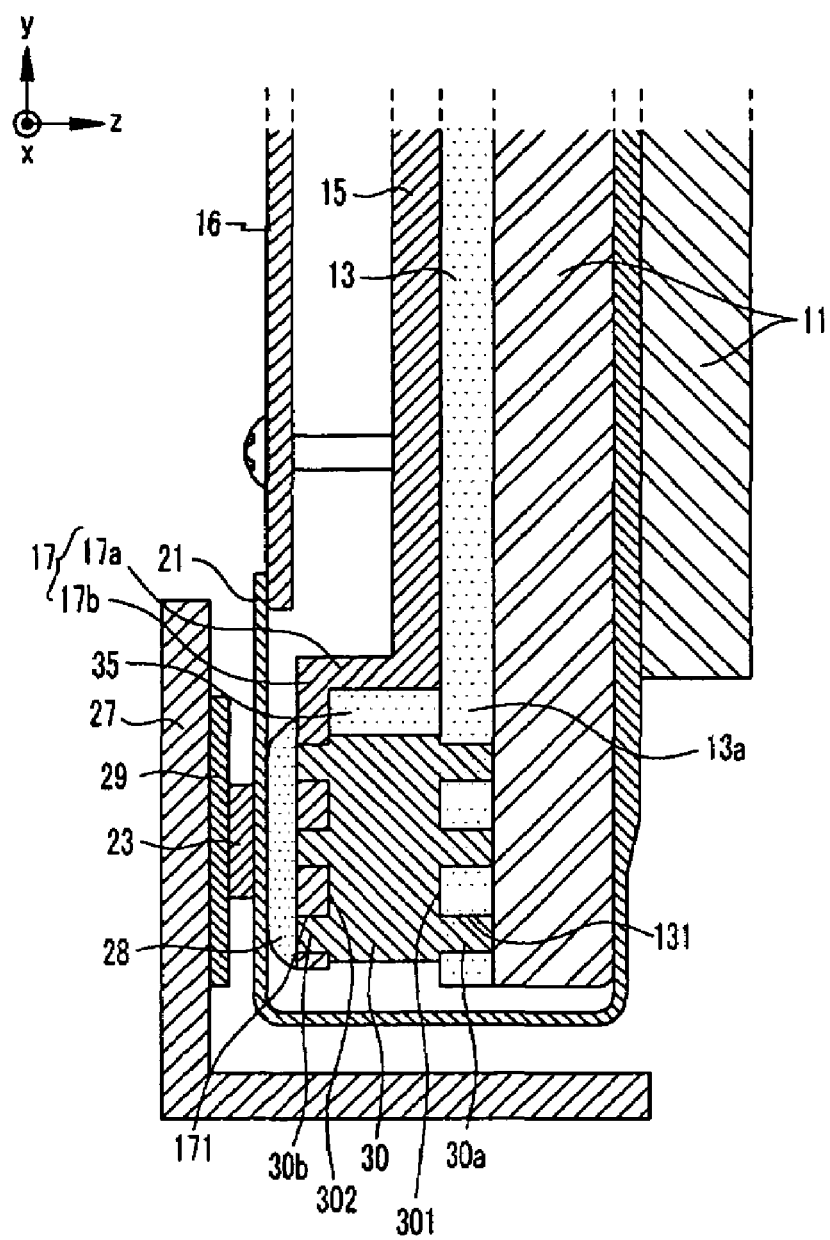
FIG. 4 is a partial sectional view of a plasma display device according to another exemplary embodiment of the present invention.

FIG. 4 is a partial sectional view of a plasma display device according to another exemplary embodiment of the present invention. Referring to FIG. 4, at least two thermal conduction members 30, 35 having different shapes are mounted between the second portion 17b of the chassis base 15 and the extension portion 13a of the thermal conduction sheet 13. More specifically, the thermal conduction members 30, 35 include a first thermal conduction member 30 having heat dissipation fins 30a, 30b, and a second thermal conduction member 35 substantially formed as a rectangular parallelepiped.

The second thermal conduction member 35 may be securely fixed to the first portion 17a of the chassis base 15 and formed to fill the space between the extension portion 13a and the reinforcing portion 17. The second thermal conduction member 35 may be formed of the same material as that of the thermal conduction sheet 13.

The present exemplary embodiment may improve heat dissipation efficiency because the heat dissipation area and the contact area are increased by filling the space between the extension portion 13a and the reinforcing portion 17 with two different types of thermal conduction members 30, 35.

Figure 5:
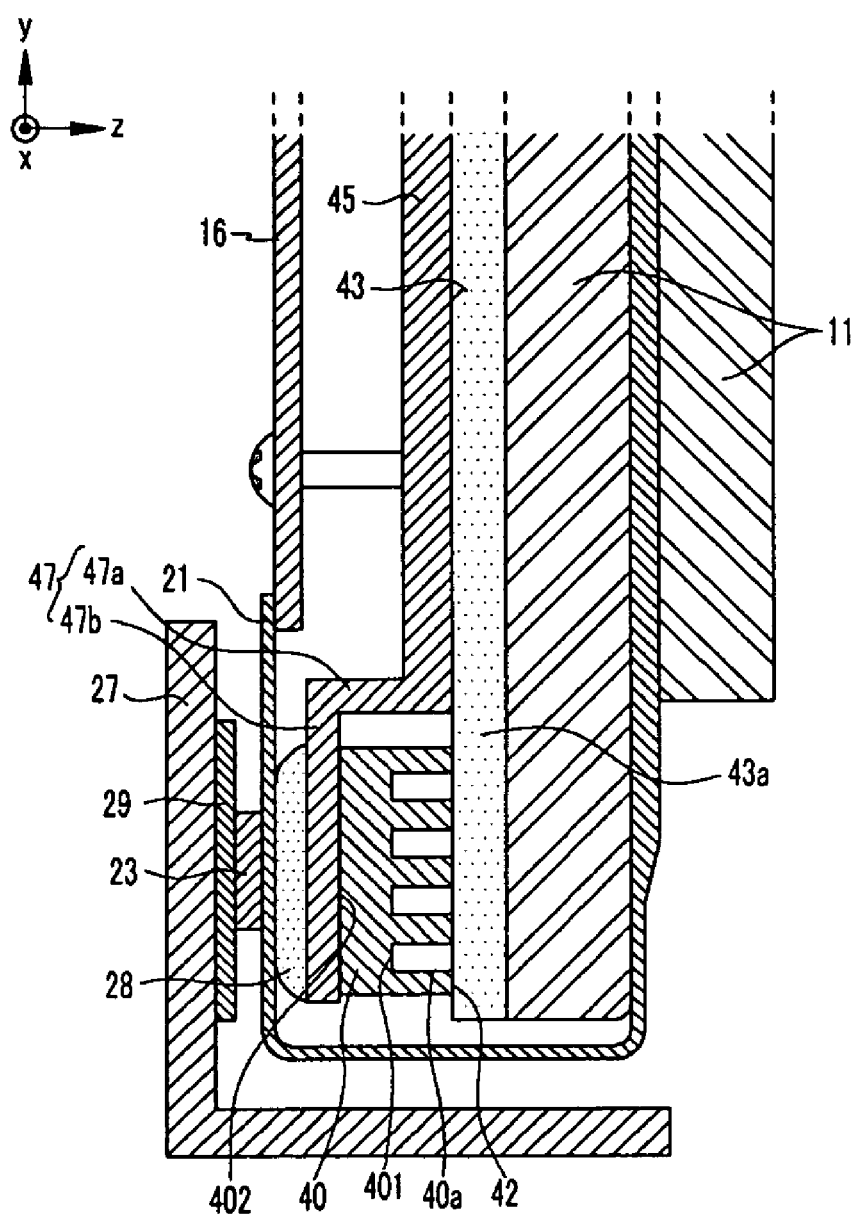
FIG. 5 is a partial sectional view of a plasma display device according to yet another exemplary embodiment of the present invention.
Figure 6:
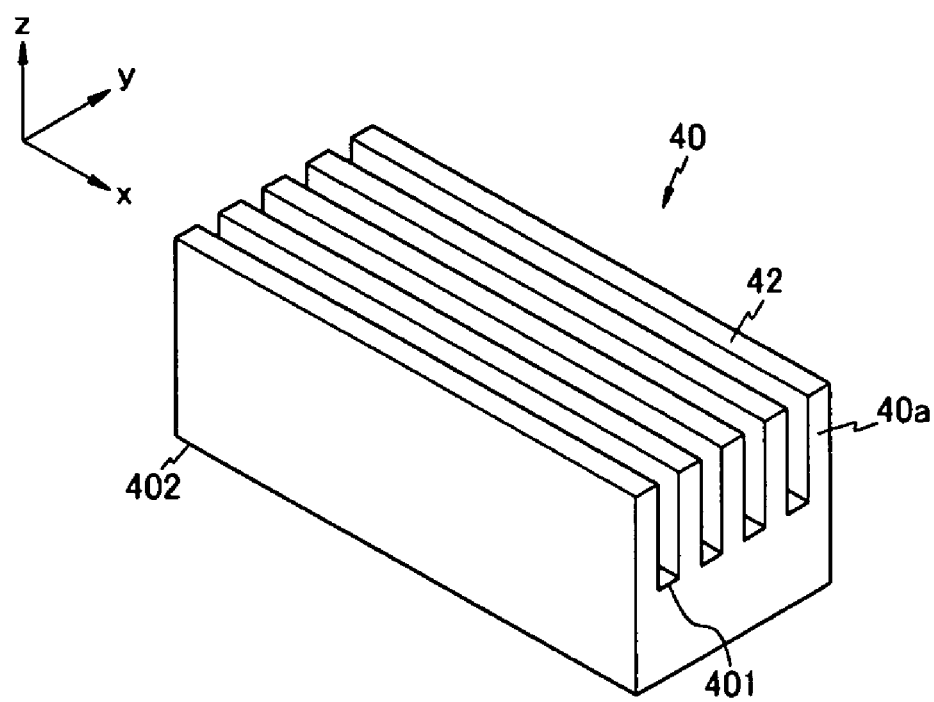
FIG. 6 is an enlarged perspective view of a thermal conduction member according to the plasma display device of FIG. 5.

FIG. 5 is a partial sectional view of a plasma display device according to another exemplary embodiment of the present invention, and FIG. 6 is an enlarged perspective view of a thermal conduction member according to the exemplary embodiment of FIG. 5.

A reinforcing portion 47 including a first portion 47a and a second portion 47b formed on a chassis base 45, and a thermal conduction member 40 mounted between the reinforcing portion 47 and an extension portion 43a of a thermal conduction sheet 43.

Referring to FIGS. 5 and 6, in the present exemplary embodiment a heat dissipation fin 40a is formed on a first surface 401 of the thermal conduction member 40. However, a heat dissipation fin is absent from a second surface 402 of the thermal conduction member 40. Additionally, a hole corresponding to the heat dissipation fin 40a is absent at the extension portion 43a of the thermal conduction sheet 43.

Accordingly, the edge surface 42 of the heat dissipation fin 40a formed on the first surface 401 of the thermal conduction member 40 is directly fixed to the extension portion 43a of the thermal conduction sheet 43, and the second surface 402 of the thermal conduction member 40 is fixed to the second portion 47b forming the reinforcing portion 47 of the chassis base 45. In this case, the heat dissipation fin 40a may be securely mounted because of its increased edge 42 surface as a result of forming it as a plate.

In the present exemplary embodiment, heat generated from the driver IC 23 may be dissipated efficiently by securely fixing the heat dissipation fin 40a to the thermal conduction sheet 43.

Figure 7:
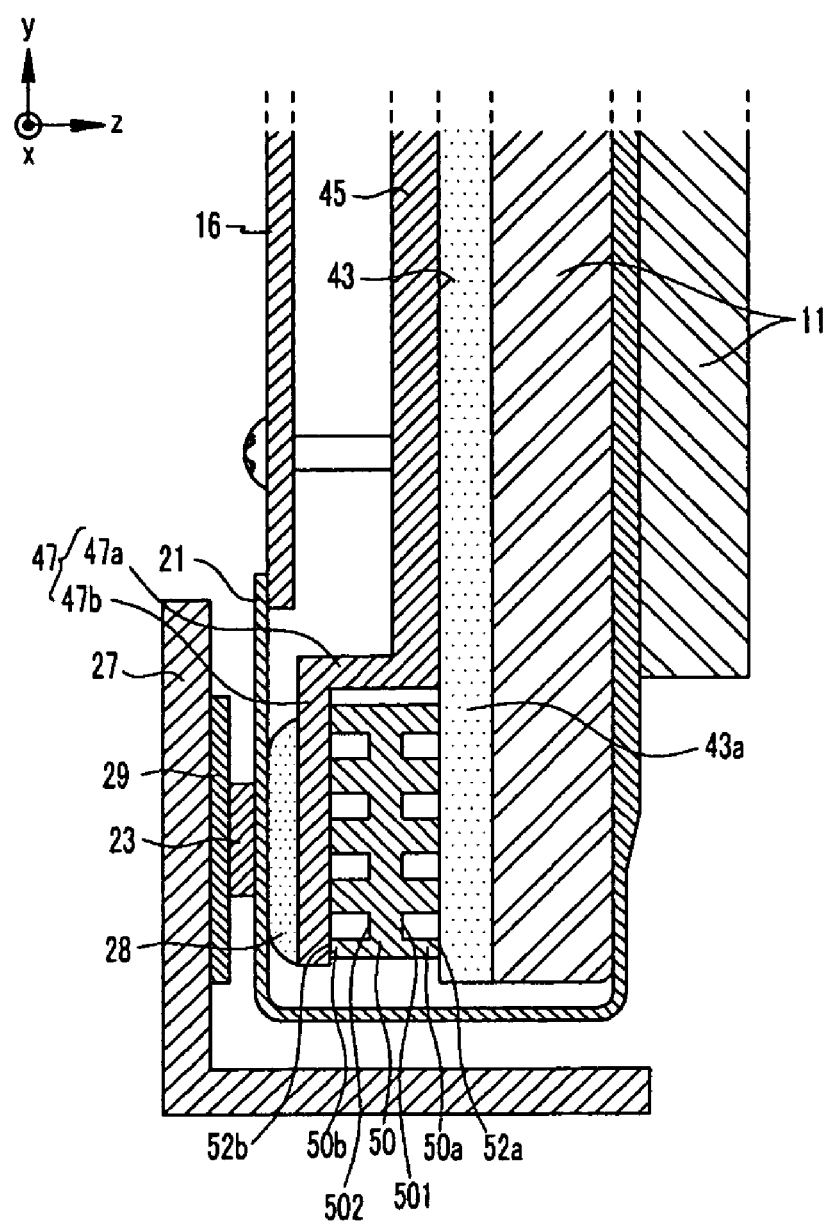
FIG. 7 is a partial sectional view of a plasma display device according to still another exemplary embodiment of the present invention.
Figure 8:
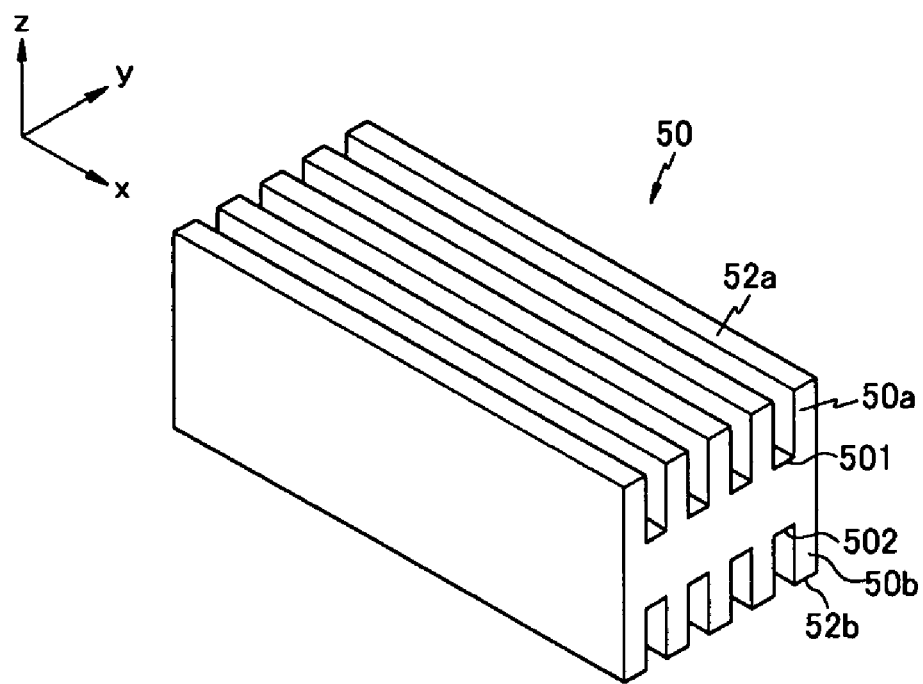
FIG. 8 is an enlarged perspective view of a thermal conduction member according to the plasma display device of FIG. 7.

FIG. 7 is a partial sectional view of a plasma display device according to yet another exemplary embodiment of the present invention, and FIG. 8 is an enlarged perspective view of a thermal conduction member according to the display device of FIG. 7.

Referring to FIGS. 7 and 8, a first heat dissipation fin 50a is formed on a first surface 501 of a thermal conduction member 50, and a second heat dissipation fin 50b is formed on a second surface 502 of the thermal conduction member 50. An edge surface 52a of the first heat dissipation fin 50a is securely fixed to an extension portion 43a of a thermal conduction sheet 43, and an edge surface 52b of the second heat dissipation fin 50b is securely fixed to a second reinforcing portion 47b of a chassis base 45. In this case, the heat dissipation fins 50a, 50b may be formed as plates to increase the area of the edge surfaces 52a, 52b.

The above exemplary embodiments include assembly methods in which a heat dissipation fin is directly fixed or inserted into a thermal conduction sheet and a second portion of a reinforcing portion of the chassis base in the state of mounting the heat dissipation fin at a thermal conduction member.

Those skilled in the art can also appreciate that efficiency of thermal conduction may be further improved by inserting a heat dissipation pad between the second portion of the chassis base and the thermal conduction member. The heat dissipation pad may be inserted between the second surface and the second portion of the thermal conduction member to improve the heat conduction efficiency therebetween.

Additionally, the heat dissipation fin may be formed in various forms such as cylinders or plates. Additionally, the heat dissipation fin may be formed with a corrugated aluminum plate.

The scope of the present invention should therefore not be construed as limited to the exemplary embodiments set forth herein, and should be defined by the appended claims and equivalents thereof.

While this invention has been described in connection with exemplary embodiments, it should be understood that the invention is not limited to the disclosed embodiments, but, is intended to cover various modifications and equivalent arrangements included within the spirit and scope of the appended claims.

What is claimed is:

1. A display device comprising:
   a display panel, the display panel having at least one electrode and a display panel first surface;
   a chassis base having a chassis base first surface and a chassis base second surface opposite to the chassis base first surface;
   a printed circuit board assembly mounted on the chassis base second surface;
   a driver integrated circuit package having a driver integrated circuit, the driver integrated circuit package being connected to the at least one electrode and to the printed circuit board assembly;
   a thermal conduction sheet inserted between the display panel first surface and the chassis base first surface, the thermal conduction sheet having a thermal conduction sheet extension portion at a position corresponding to the driver integrated circuit; and
   a thermal conduction member mounted between the thermal conduction sheet extension portion and the chassis base at a position corresponding to the driver integrated circuit.

2. The display device of claim 1, wherein the driver integrated circuit package is formed with a tape carrier package.

3. The display device of claim 1, wherein:
   the thermal conduction member has a thermal conduction member first surface facing the thermal conduction sheet extension portion and has a thermal conduction member second surface opposite to the thermal conduction member first surface; and
   at least one heat dissipation fin is formed at the thermal conduction member first surface and/or the thermal conduction member second surface.

4. The display device of claim 3, wherein at least one hole is formed at the thermal conduction sheet extension portion or at the chassis base corresponding to a respective at least one heat dissipation fin insertable into the hole.

5. The display device of claim 3, wherein an edge surface of the at least one heat dissipation fin is securely fixed to the thermal conduction sheet extension portion.

6. The display device of claim 3, wherein a reinforcing portion is formed at an edge of the chassis base, the reinforcing portion providing a space between the thermal conduction sheet and the chassis base at a position corresponding to the driver integrated circuit in which the thermal conduction member is mountable.

7. The display device of claim 6, wherein the reinforcing portion of the chassis base includes a reinforcing portion first portion extending perpendicular to a planar surface of the display panel and a reinforcing portion second portion extending from the reinforcing portion first portion parallel to the planar surface on which the display panel is mounted.

8. The display device of claim 7, wherein:
   a first heat dissipation fin is formed at the thermal conduction member first surface;
   a second heat dissipation fin is formed at the thermal conduction member second surface;
   a first hole is formed corresponding to the first heat dissipation fin at the thermal conduction sheet extension portion; and
   a second hole is formed corresponding to the second heat dissipation fin at the reinforcing portion second portion.

9. The display device of claim 8, wherein the first heat dissipation fin is insertable into the first hole, the second heat dissipation fin is insertable into the second hole, and the thermal conduction member is fixable between the thermal conduction sheet and the chassis base.

10. The display device of claim 7, wherein:
    a heat dissipation fin is formed at the thermal conduction member first surface;
    an edge surface of the heat dissipation fin formed at the thermal conduction member first surface is fixed to the thermal conduction sheet extension portion; and
    the thermal conduction member second surface is fixed to the reinforcing portion second portion of the chassis base.

11. The display device of claim 7, wherein:
    a first heat dissipation fin is formed at the thermal conduction member first surface;
    a second heat dissipation fin is formed at the thermal conduction member second surface;
    a first heat dissipation fin edge surface is fixed to the thermal conduction sheet extension portion; and
    a second heat dissipation fin edge surface is fixed to the reinforcing portion second portion.

12. The display device of claim 1, wherein at least two thermal conduction members having different shapes are mounted between the chassis base and the thermal conduction sheet extension portion.

13. The display device of claim 12, wherein the at least two thermal conduction members include a first thermal conduction member and a second thermal conduction member, the first thermal conduction member having a heat dissipation fin, and the second thermal conduction member being formed as a substantially rectangular parallelepiped.

14. The display device of claim 3, wherein the heat dissipation fin is formed as a cylinder.

15. The display device of claim 3, wherein the heat dissipation fin is formed as a plate.

16. The display device of claim 1, wherein the display panel is a plasma display panel.

17. A method for assembling a heat dissipating structure in a display device, the display device including a display panel, a chassis base having a chassis base first surface and a chassis base second surface opposite the chassis base first surface, a printed circuit board assembly mounted on the chassis base second surface, and a driver integrated circuit package having a driver integrated circuit, the driver integrated circuit package being connected to an electrode of the display panel and to the printed board assembly, the method comprising:
    inserting a thermal conduction sheet between the display panel and the chassis base first surface, the thermal conduction sheet having a thermal conduction sheet extension portion at a position corresponding to the driver integrated circuit;
    providing a thermal conduction member having a thermal conduction member first surface including at least one first heat dissipating fin and a thermal conduction member second surface including at least one second heat dissipating fin;
    inserting the at least one first heat dissipating fin into a first hole, the first hole being located on the thermal conduction sheet extension portion of the thermal conduction sheet;

inserting the at least one second heat dissipating fin into a second hole, the second hole being located on the chassis base.

18. The method according to claim 17, wherein the display panel is a plasma display panel.

19. The method according to claim 17, wherein the second hole is located on a reinforcing portion formed at an edge of the chassis base, the reinforcing portion providing a space between the thermal conduction sheet and the chassis base at a position corresponding to the driver integrated circuit in which the thermal conduction member is mountable.

* * * * *